United States Patent [19]
Kadokura

[11] Patent Number: 6,156,172
[45] Date of Patent: *Dec. 5, 2000

[54] FACING TARGET TYPE SPUTTERING APPARATUS

[75] Inventor: Sadao Kadokura, Hachioji, Japan

[73] Assignee: Sadao Kadkura, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/088,091

[22] Filed: Jun. 1, 1998

[30] Foreign Application Priority Data

Jun. 2, 1997 [JP] Japan ................................. 9-143590

[51] Int. Cl.⁷ .................................................. C23C 14/34

[52] U.S. Cl. ............................. 204/298.26; 204/298.12; 204/298.09

[58] Field of Search ..................... 204/298.12, 298.19, 204/298.26, 298.07, 192.2

[56] References Cited

U.S. PATENT DOCUMENTS

| | | | |
|---|---|---|---|
| 4,407,894 | 10/1983 | Kadokura et al. . | |
| 4,572,776 | 2/1986 | Aichert et al. ...................... | 204/298.09 |
| 4,767,516 | 8/1988 | Nakatsuka et al. ................ | 204/298.26 |
| 4,784,739 | 11/1988 | Kadokura et al. . | |
| 4,842,708 | 6/1989 | Kadokura et al. . | |
| 5,000,834 | 3/1991 | Yoshikawa ......................... | 204/192.12 |
| 5,328,582 | 7/1994 | Cole .................................... | 204/298.26 |
| 5,328,583 | 7/1994 | Kameyama et al. .............. | 204/298.26 |
| 5,482,604 | 1/1996 | Ahonen .............................. | 204/298.26 |

FOREIGN PATENT DOCUMENTS

| | | | |
|---|---|---|---|
| 62-14633 | 4/1987 | Japan . | |
| B262-14633 | 4/1987 | Japan ............................. | C23C 14/34 |
| 63-20303 | 4/1988 | Japan . | |

(List continued on next page.)

OTHER PUBLICATIONS

Chung–Hoo Park et al., "TiN hard coating prepared by sputter ion plating system with facing target sputtering source and RF discharge", Thin Solid Films 312 (1998), pp. 182–189.

*Primary Examiner*—Nam Nguyen
*Assistant Examiner*—Gregg Cantelmo
*Attorney, Agent, or Firm*—Armstrong, Westerman, Hattori, McLeland & Naughton

[57] ABSTRACT

A new structure of plasma generating unit and a compact configuration of the combination of plasma space and substrate holders for a facing target sputtering apparatus which includes: an arrangement for defining box-type plasma units supplied therein with sputtering gas mounted on outside wall-plates of a closed vacuum vessel; at least a pair of targets arranged to be spaced apart from and face one another within the box-type plasma unit, with each of the targets having a sputtering surface thereof; a framework for holding five planes of the targets or a pair of facing targets and three plate-like members providing the box-type plasma unit so as to define a predetermined space apart from the pair of facing targets and the plate-like members, which framework is capable of being removably mounted on the outside walls of the vacuum vessel with vacuum seals; a holder for the target having conduits for a coolant; an electric power source for the targets to cause sputtering from the surfaces of the targets; permanent magnets arranged around each of the pair of targets for generating at least a perpendicular magnetic field extending in a direction perpendicular to the sputtering surfaces of the facing targets; devices for containing the permanent magnets with target holders, removably mounted on the framework; and a substrate holder at a position adjacent the outlet space of the sputtering plasma unit in the vacuum vessel. The unified configuration composed of a cooling device for cooling both the backside plane of the targets and a container of magnets in connection with the framework improves the compactness of sputtering apparatus.

19 Claims, 4 Drawing Sheets

FOREIGN PATENT DOCUMENTS

| | | | |
|---|---|---|---|
| 63-20304 | 4/1988 | Japan . | |
| B263-20303 | 4/1988 | Japan | C23C 14/34 |
| B263-20304 | 4/1988 | Japan | C23C 14/36 |
| 63-54789 | 10/1988 | Japan . | |
| B263-54789 | 10/1988 | Japan | C23C 14/34 |
| B2H3-2231 | 1/1991 | Japan | C23C 14/35 |
| H3-2231 | 1/1991 | Japan . | |
| B2H4-11624 | 3/1992 | Japan | C23C 14/34 |
| H4-11624 | 3/1992 | Japan . | |
| B2H5-75827 | 10/1993 | Japan | C23C 14/34 |
| H5-75827 | 10/1993 | Japan . | |
| H10-8246 | 1/1998 | Japan . | |

FACING TARGET TYPE SPUTTERING APPARATUS

BACKGROUND OF THE INVENTION

1. Field of the Invention

The present invention relates generally to apparatus for producing thin uniform films or layers, such as magnetic thin films, on a substrate by sputtering. More particularly, the present invention relates to a facing target type of sputtering apparatus. In a facing target type of sputtering apparatus, at least a pair of target planes are arranged to face each other in a vacuum vessel, and magnetic fields are generated perpendicularly to the target planes for confining plasma in the space between the facing target planes. The substrate is arranged so as to be positioned at the side of the space so that films are produced on the substrate by sputtering.

2. Description of the Related Art

Figure 1:
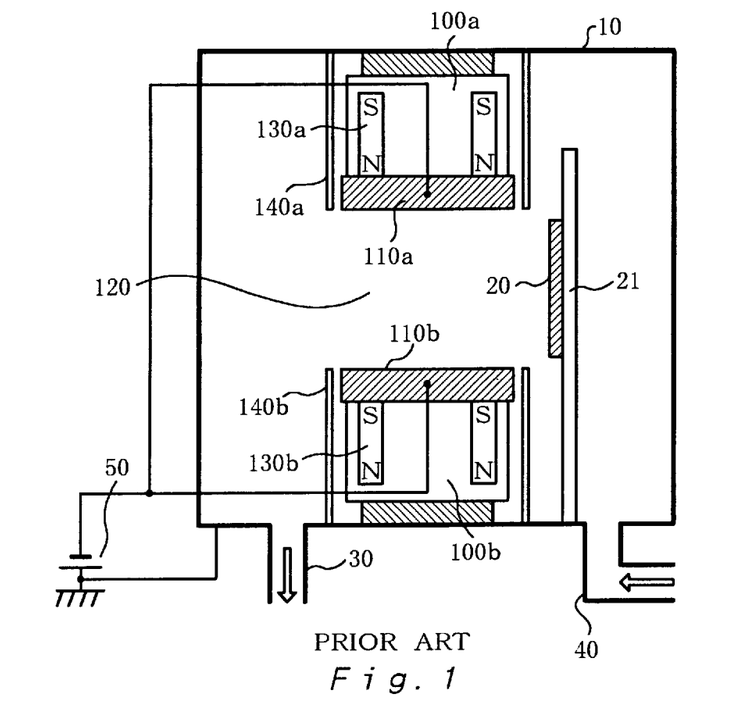
FIG. 1 is a schematic view of the entire construction of a conventional facing target type sputtering apparatus.

A typical facing target type of sputtering apparatus as shown in FIG. 1 is disclosed in Japanese Examined Patent Publication No. 63-20303, 63-20304 and 62-14633 applied by the present inventor and others includes a vacuum vessel 10 for defining therein a confined vacuum chamber, an air exhausting unit (not shown) having a vacuum pump system to cause a vacuum via an outlet 30, and a gas supplying unit (not shown) for introducing a preselected sputtering gas into the vacuum vessel via an inlet 40 so that the introduced gas pressure within the vacuum vessel is maintained at a predetermined level. A pair of target portions 100a and 100b are arranged to be in the vacuum vessel 10 in such a manner that a pair of rectangular shape cathode targets 110a and 110b face each other so as to define a predetermined space therebetween. The substrate holder 21 supports a substrate 20 at a position beside the pace 120 extending the outlet of the facing targets 110a and 110b, and is arranged to be perpendicular to the planes of the targets 110a and 110b. The targets 110a and 110b are electrically connected to a later-described electric power source 50 to cause sputtering from the surfaces of targets 110a and 110b. And magnetic fields are generated to cover vertically the outside of the space between facing target planes by the arrangement of magnets 130a and 130b installed in touch with the backside planes of facing targets 110a and 110b. Shield plates 140a and 140b are used for maintaining sputtering plasma stably in a defined space between facing target planes while sputtering.

As illustrated in FIG. 1, the facing targets 110a and 110b to be a cathode, and the shield plates 140a and 140b to be the anode (the earth) are electrically connected to the output terminals of a direct current (DC) power source 50. The vacuum vessel 10 and the shield plates 140a and 140b are electrically connected to the anode, too. Under a predetermined pressure level of approximately $10^{-2} \sim 10$ Pa, sputtering plasma is formed in the space 120 between the facing targets 110a and 110b while applying an electric power from the power source 50. Since magnetic fields are generated around the peripheral area extending in a direction perpendicular to the surfaces of facing targets 110a and 110b, highly energized electrons sputtered from surfaces of the facing targets are confined in the space 120 between facing targets 110a and 110b to cause increased ionized gases by collision in the space. The ionization rate of the sputtering gases corresponds to the deposition rate of thin films on the substrate 20, then, high rate deposition is realized due to the confinement of electrons in the space 120 between the facing targets 110a and 110b. The substrate 20 is arranged so as to be isolated from the plasma space 120 between the facing targets 110a and 110b. Film deposition on the substrate is processed at a low temperature range due to a very small number of impingement of plasma from the plasma space and small amount of thermal radiation from the target planes. A typical facing target type of sputtering method has superior properties of depositing ferromagnetic materials at high rate deposition and low substrate temperature in comparison with a magnetron sputtering method. Facing target types of sputtering apparatus are used mainly for the production of films of magnetic materials, magnetic recording layers and magnetic heads due to superior confinement of electrons between facing target space.

However, when the circular or rectangular types of target are usually used, the central areas of facing targets are locally and concentrically eroded. Therefore, the efficiency in use of the sputtering surface of the facing targets is low. In addition, an uneven thickness of the film occurs in the direction of the width of a substrate, and accordingly, the conventional facing target type of sputtering apparatus is not suitable for a large-scale production of films.

To overcome these problems encountered by the above-described facing target type of sputtering apparatus, the present inventor and others proposed a different facing target type of sputtering apparatus in Japanese Examined Patent Publications No.H3-2231 and S63-54789. The proposed facing target type of sputtering apparatus has a construction such that magnetic core members forming a part of a magnetic field generating unit are arranged to be installed in the outer space around the facing targets. Thus, magnetic fields are concentratedly generated in the region surrounding the facing targets and the space therebetween. Therefore, the distribution of the magnetic fields is not affected by the magnetic permeability and saturated magnetization of the materials of facing targets or the thickness of the targets, and thus is always stable. Furthermore, since the magnetic field for capturing or confining plasma is generated around the outside area surrounded by the facing targets, the eroded area of target surfaces extends from the central portion toward the periphery of target surfaces. Accordingly, the efficiency in use of targets is remarkably improved. However, a high range of sputtering gas pressure is needed for sputtering which results in degraded quality of thin films deposited on such substrates. Moreover, the present inventor and others proposed another type of FTS (Facing Target Type Sputtering) apparatus in Japanese Examined Patent Publications No.H4-11624 and H5-75827 (U.S. Pat. No. 4,784,739) in order to generate the more homogenous distribution of plasma confinement near the whole sputtering surfaces of the facing target-planes. The proposed facing target type of sputtering apparatus has reflecting electrodes of electrons in the space being installed between the edge of target and the shield plate, so that the electrons are reflected to be confined in the plasma space by the reflecting electrodes. As a result, it was confirmed that the electric discharge characteristic is much improved and that a film having an excellent quality is produced under a low gas pressure and a low discharge voltage due to high rate of ionizing gases. It was also confirmed that an auxiliary magnetic field having magnetic flux parallel to the target planes is generated along around the outer peripheries of the targets and adjacent to the front surfaces of the targets for capturing sputtered electrons in the plasma space. The electric, discharge characteristic is remarkably improved in addition to the auxiliary magnetic field. Furthermore, the eroded areas of the facing targets are extensively increased, i.e., the eroded areas of facing targets are remarkably expanded to all the surfaces of targets. This implies that a uniform erosion of the entire surfaces of targets is realized.

However, even in use of the facing target type of sputtering apparatus, recoiled gases and atoms sputtered from the surfaces of facing targets are transferred from the plasma space 120 between facing target planes toward all the directions on the wall of the vacuum vessel. Therefore, even in use of the proposed facing target type of sputtering apparatus, the deposition ratio on the substrate out of all the sputtered particles is limited in accordance with the configuration of the vacuum vessel 10 as illustrated in FIG. 1, and most of sputtered particles become contaminants on the surface of the vacuum chamber wall, because the porous structure and powders of contaminants contains a lot of air, $H_2O$ and some gases.

In order to overcome the low efficiency rate of conversion of the sputtered particles to the deposited thin films on a substrate and the degradation of thin film quality due to the impingement of contaminants, the present inventor proposed a new type of facing target apparatus in Japanese Unexamined Patent Publications No.H8-162676, a box type of plasma confinement apparatus. This type of facing target type of sputtering apparatus is characterized by unique distributions of the magnetic and electric fields due to a five target arrangement in which the box-type space composed of all the five target planes has only one outlet extending toward the plane of a substrate in the vacuum vessel 10. The construction of the box-type of plasma space is composed of the first pair of facing target planes arranged to face each other so as to define a predetermined space; the second target planes are adjacent to the first pair of facing target planes arranged to cover all the side portion except the outlet facing the substrate arranged in the vacuum vessel 10. In order to confine sputtering plasma in the box type of plasma space, a pair of magnetic field generating means composed of a pair of permanent magnets so as to face N and S-pole generate magnetic flux circulating perpendicularly the outside space of the first facing targets which defines facing target mode in combination with electric fields perpendicular to target planes in plasma space. The pair of magnetic field generating means generate conventional magnetron mode which is composed of closed magnetic flux from the pole of magnets in the vicinity of the outside area of the pair of target planes in addition to the facing target mode. The cathodes of all the targets are arranged so as to recoil and confine the electrons into the plasma space by the aid of both the facing target mode and the magnetron mode as aforementioned.

In this box-type of facing target sputtering apparatus, the problems of the all the facing target types of sputtering apparatus are overcome because dense plasma can be generated and confined in the space enclosed by all the five target planes, and sputtered particles generated in the plasma space are transferred from the outlet to the substrate plane in the vacuum vessel 10.

By the way, the quality of thin films deposited at higher rate by the addition of larger input power was confirmed to become degraded rapidly corresponding to a certain high deposition rat e in both the improved facing target type of sputtering apparatus and the box-type of facing target sputtering. The tendency of degrading film quality was remarkably apparent corresponding to larger input powers under the improved facing target type of sputtering apparatus proposed in Japanese Examined Patent Publications No.H4-11624 a and H5-75827 (U.S. Pat. No. 4,784,739). The limitation of the deposition rate due to the degradation of film quality is a fatal problem in the industrial application, because production cost of thin films is largely dependent on the deposition speed of the equipment in the industrial production.

SUMMARY OF THE INVENTION

An object of the present invention is to obviate the degradation of thin films encountered by the afore-described conventional facing target type of sputtering apparatus and the box-type of facing target type of sputtering one, on the basis of the research experiments and redesigned apparatus.

Another object of the present invention is to provide a facing target apparatus composed of a simplified configuration with a remarkably improved cooling mechanism of the target holder in which the magnetic field generating means is installed.

A further object of the present invention is to provide a new facing target type sputtering apparatus applicable for high productivity and precisely separated multi-layered films deposited layer by layer, composed of a compact configuration due to small space of a vacuum vessel.

In accordance with one aspect of the present invention, there is provided a facing target apparatus for applying the improved cooling mechanism of the target supporting unit with the magnetic field generating m means, which comprises:

means for defining a closed vacuum vessel supplied therein with sputtering gas;

a pair of targets arranged to be spaced apart from and face one another within said vacuum vessel, each of the targets having a surface thereof;

means for stationarily supporting said targets so as to define a predetermined space between said pair of facing targets, removably mounted on outside wall-planes of said vacuum vessel with vacuum sealing means;

means for applying an electric power to said pair of targets to cause sputtering from the surfaces of said targets;

magnetic field generating means of permanent magnets arranged around each of said pair of targets for generating a vertical magnetic field extending in the direction vertical to said sputtered surfaces of said facing targets;

unit means for containing said permanent magnets having therewith said holding means for said pair of facing targets, removably mounted on said means for holding said pair of facing targets with vacuum sealing means means for holding the substrate at a position beside the space extending between the pair of facing targets;

In accordance with another aspect of the present invention, a facing target type apparatus for producing films on substrates comprising:

means for defining box-type units mounted on outside wall-planes of a closed vacuum vessel supplied therein with sputtering gas;

at least a pair of targets arranged so as to be spaced apart from and face one another within said box-type plasma units, each of said facing targets having a sputtering surface thereof;

framework means for holding five planes of targets or a pair of targets and three plate-like members composing said box-type unit so as to define a predetermined space apart from said pair of facing targets and said plate-like members, capable of removably mounted on said outside wall-planes of said vacuum vessel with vacuum sealing means;

holding means for said target having therein conduits for coolant;

means for applying an electric power to said pair of targets to cause sputtering from the surfaces of said targets;

magnetic field generating means of permanent magnets arranged around each of said pair of targets for generating at least a perpendicular magnetic field extending in a direction perpendicular to said sputtering surfaces of said facing targets;

unit means for containing said permanent magnets having therewith said holding means for said target, removably mounted on said framework means for holding five planes of said pair of targets and plate-like members with vacuum sealing means; and means for holding said substrate at a position beside space extending the outlet of said sputtering plasma unit in said vacuum vessel.

The present invention was mainly attained from the precise investigation on the relationship between the degradation of thin film quality and gases; desorbing from both the magnets and the wall surface of the vacuum vessel after heating the magnets and the vacuum vessel corresponding to the deposition time interval applying higher input powers. And, also, after a lot of operations, the degradation of thin film quality was confirmed by impingements of energized electrons onto the deposition plane corresponding to a shortage of confining plasma in the plasma space due to the decreased strength of magnetic fields after thermal stress on the magnets.

In accordance with the facing target type of sputtering apparatus of the present invention, the structure of facing target plasma unit comprises:

(1) an engineered unit having a precisely machined conduit for cooling a back plate of target by circulating such coolant as water (including the configuration of the surface of the conduit being fused with the backplate of the target), composed of such materials possessing both a high value of thermal conductivity and enough strength as processed copper alloys, aluminum alloys and so on;

the conduit being formed in either said backplate of target or said engineered unit thereof;

(2) said engineered unit containing magnets of the magnetic field generating means in air having therewith said conduit for cooling said backplate of target, and the edge of the magnets connecting with a yoke such as iron, if necessary.

Accordingly, the cooling rate of the target is remarkably improved by the invention, because the high rate of flowing the coolant in the conduit removes efficiently large thermal energy due to the large thermal conduction (by turbulent flow of coolant) on the surface boundary of the backplate of the target being heated via the conduction of large thermal generation on the surface of the target by high rate sputtering. And, also, the same coolant circulates in the conduit so as to cool and maintain in a low temperature range of the engineered unit due to the material with high thermal conductivity because of small change of temperatures between the coolant and said unit. The magnets being contained in the engineered unit are easily maintained to be at a low temperature of said unit without contacting coolant and generate a predetermined magnetic flux in the space of facing targets via the wall of said container of magnets from the air side. As the engineered unit can be easily adapting for the size of magnets, a certain magnetic flux in the space is precisely generated and stably maintained for a long term of operation with no change of the predetermined magnetic flux.

Rare earth magnets such as Sm—Co and Ad—Fe—B having large magnetic energy are preferentially adopted for the magnetic field generating means in the present invention due to the small size of container for the magnets and homogenous distribution of the magnetic flux in the addition of a yoke to the pole of magnet. The present invention provides a compact and simple structure of a box-type unit for generating and confining dense sputtering plasma because the surfaces of rare earth magnets in the container are sealed from the active gases such as $H_2O$, $O_2$ and Cl under a hot temperature, otherwise magnetic properties of rare earth magnets are easily degraded by the reaction with afore-mentioned gases. The present invention is widely adapted for all the facing target type sputtering apparatus in which the magnets of magnetic field generating means are arranged to be contained along the outside position of the facing targets. Especially, the poles of said magnets mounted to be a few millimeter protruded beyond the front surfaces of the facing targets in the plasma space for effective combination forming dense plasma space surrounded inside the front side surfaces of five targets composing the box-type plasma unit with one open-side outlet toward said vacuum vessel and five closed-sides of target planes or plate-like members, because the protruded magnet poles arranged along the outside position of the facing targets generate a homogeneously predetermined magnetic flux parallel to the surface of said target in the near space of the adjacent front side of targets. The combination of said permanent magnets and application of power supply enables an increase in the efficient generation of dense plasma in the box-type plasma space without heating the magnets in the present invention. A fatal problem with heating the protruded poles of magnets by the exposure of sputtering plasma results in the arrangement of magnets such as the afore-mentioned conventional mechanisms, so the present invention provides extremely remarkable effects of no degradation with deposited film quality due to a perfect solution to the fatal problem of heating magnets in a vacuum.

Furthermore, the present invention provides a small size of box-type plasma space for a remarkably high productivity of thin films under ultra-clean vacuum conditions, comprising:

said box-type unit of facing target plasma space being comprised of five front side planes of said targets and/or plate-like members in addition to said facing targets mounted on the outside wall-planes of a closed vacuum chamber with vacuum sealing means;

said substrate holders arranged so as to be spaced apart from and face said outlet of the plasma space of box-type unit.

In addition, the present invention provides multi small box-type plasma units mounted on outside wall-planes of the vacuum vessel for depositing multi-layers of thin films continuously at a remarkably high throughput under ultra-clean vacuum conditions, comprising:

means for defining multi box-type plasma units being comprised of five planes of plate-like members and/or said targets in addition to a pair of facing targets mounted on outside wall-planes of said vacuum vessel supplied therein with sputtering gas;

means for holding the rotary substrates at a position beside space extending the outlet of said box-type plasma unit.

The multi-plasma unit apparatus of the present invention enables the deposition of precisely tailored multi-layers and high quality thin films on a substrate continuously in a vacuum, because the pre-selected sputtering gases are separately supplied into the plasma space via the inlet of each box-type unit and exhausted by a vacuum system connected with the vacuum vessel. So, the sputtered particles and gases generated in each box-type space are transferred to the substrate plane without contaminants as in other box-type spaces by using simple shutters in the vacuum vessel as equipped in a conventional sputtering apparatus.

Figure 2:
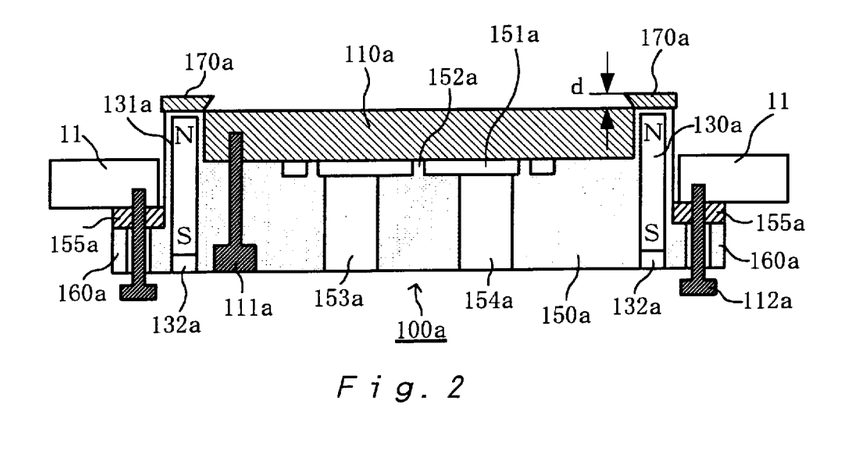
FIGS. 2 and 3 are cross-sectional views of one of the facing cathode portions of the present invention accommodated in the sputtering apparatus of FIG. 1.

According to a first embodiment of the present invention as shown in FIG. 2, a representative portion 100a in FIG. 2 is in principle different from the intrinsic construction of the target portions disclosed in Japanese Examined Patent Publications No.H4-11624 and H5-75827 (U.S. Pat. No. 4,784, 739) in FIG. 1. The embodiment of a target unit in FIG. 2 provides remarkably improved cooling mechanism, compactness and the functions of recoiling electrons in the space.

Figure 3:
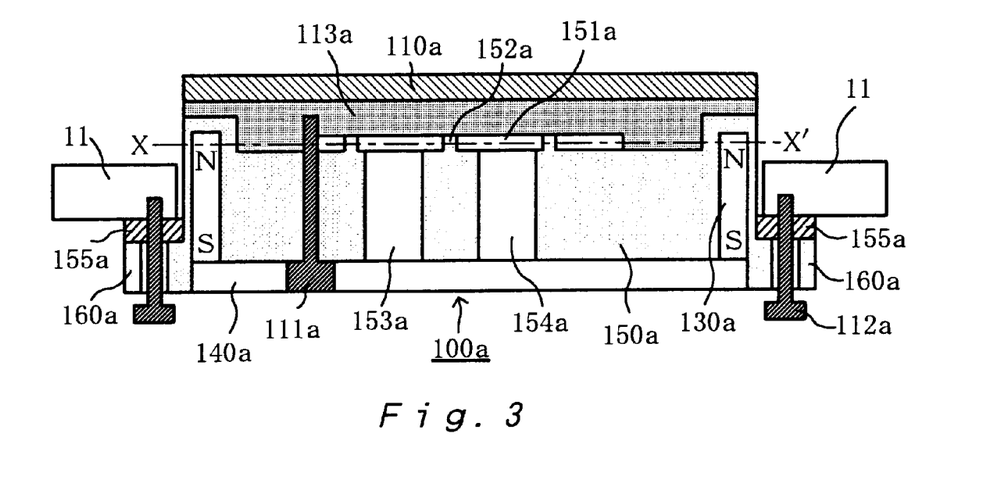

According to this embodiment of the present invention, the target portion 100a comprising the cooling block 150a possessing the magnets in one container arranged outside the cooling ditch 151a connecting with the backside of a target in FIGS. 2 and 3 are in principle different from the target portions disclosed in Japanese Examined Patent Publications No. S63-20304 in which the magnets installed in the target cooling mechanism are arranged outside behind the backside of targets.

BRIEF DESCRIPTION OF THE DRAWINGS

The above and other objects, features and advantages of the present invention will be made more apparent from the ensuing description of the preferred embodiments of the present invention with reference to the accompanying drawings wherein.

The same reference numerals in FIGS. 1–8 are used to designate the same elements.

DESCRIPTION OF THE PREFERRED EMBODIMENT

Figure 4:
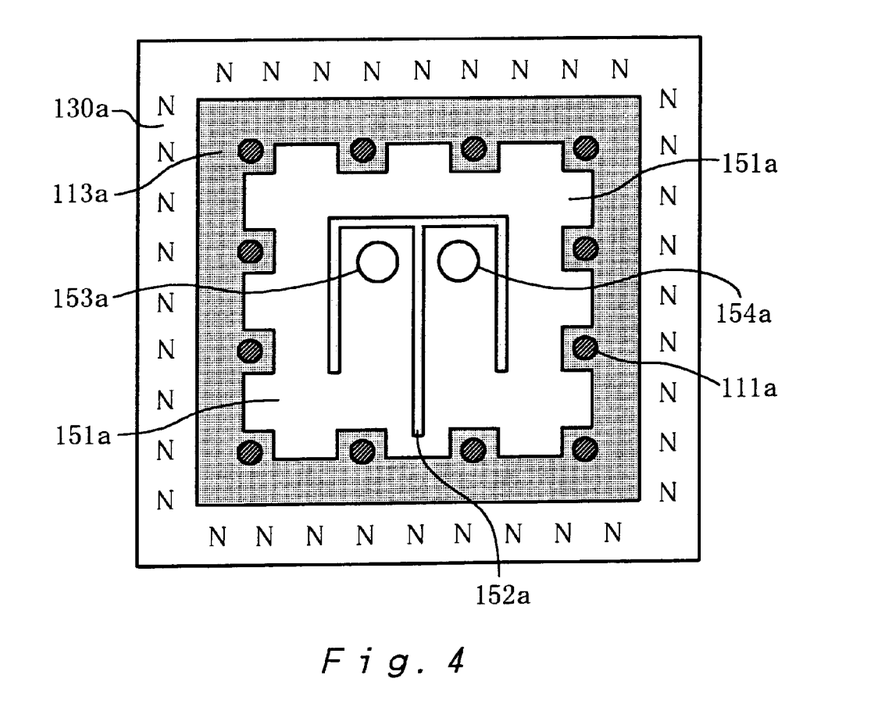
FIG. 4 is a plan view of the back plate of a target taken along the line X–X', of FIG. 3.

As illustrated in FIGS. 2, and 3 the target cathode portion 100a is mounted on the side wall 11 of the vacuum vessel 10 (see FIG. 1) with screw bolts 112a via vacuum seal of O-ring (not shown). The construction of a facing target cathode portion is the same as the target cathode portion 100a except for the arrangement of the poles of magnets of magnetic field generating unit 130a being the reverse pole. The target 110a is mounted on the front surface of the cooling block 150a of a holding means so as to be easily fixed and removed by using screw bolts 111a being arranged at a certain distance interval along the periphery of the cooling block 150a. A cooling ditch 151a with a separation plate 152a as illustrated in FIG. 4 is formed on the front surface of the cooling block 150a, forms a cooling jacket (cooling conduit) after mounting the backside plane of the target 110a on the surface of the cooling block 150a. As above-mentioned, the cooling ditch 151a is formed on the cooling block 150a in FIG. 2. And in FIG. 4, the cooling ditch 151a is formed on the backing plate 113a. Accordingly, the construction of the cooling jacket in the present invention is applicable for remarkably high deposition due to the high efficiency of the cooling rate.

The attaching portion 160a of the cooling block 150a is mounted on the front side wall 11 of the vacuum vessel 10 via an electrically insulated plate 155a by using screw bolts 112a arranged at a certain distance interval and O-ring type of vacuum seal members in the attaching portion 160a.

A magnet holding portion 131a containing a magnetic field generating means 130a is engineered in the cooling block 150a so as to surround the outside edges of target 110a, and provides a stripe-type plate 170a protruding a certain distance (d) from the surface plane of the target 110a as shown in FIG. 2. In-plane magnetic flux enclosed from the quasi-pole of magnets, i.e., an effective magnet core, to the adjacent surface of the target 110a is generated because the surface of the pole edge of magnet 130a (N-pole), said stripe-type plate 170a composed of ferromagnetic materials induces the N-pole of magnet 130a. In-plane magnetic flux enclosed from the pole of magnets to the adjacent surface of the target 110a is also generated when the N-pole of magnet 130a being arranged behind the backside plane of target 110a of non-magnetic material as illustrated in FIG. 3, due to the generation of the magnetic flux of the magnet from N pole to S pole in the outside space.

As illustrated in FIGS. 2 and 3, said holding portion 131a in the cooling block 150a is preferentially adapted to be a trench-like construction tailored to a pre-determined shape in depth and width with an open space for installing and removing magnets; 130a of the magnetic field generating unit outside the vacuum vessel 10 in the atmosphere. Tile magnetic field generating unit is composed of a parallel array of magnets 130a being contained in the holding portion 131a so as to be a pair of poles illustrated in FIG. 1. Plural magnets contained in the magnet holding portion 131a are preferentially sealed from air with a sealing material and a sealing plate 132a.

The cooling block 150a having the magnet holding portion 131a and the attaching portion 160a together in the same block is preferentially tailored to the illustrated configuration in FIGS. 2–4 in the present invention from the pre-selected block of such machining materials as aluminum alloys with high thermal conductivity by using a computerized numerical machining machine. And then the cooling ditch 151a and all the holes 153a, 154a connecting to the cooling ditch 151a and holes (not index number) for the screw bolts 111a end 112a are also tailored precisely to the pre-determined shapes by using the computerized numerical machining machine, too. Thus, the engineered block of aluminum alloys and the target portion 100a of the present invention provides a precise construction and remarkably improved functions with no leakage of gases from magnets 110a of the magnetic field generating unit into the vacuum vessel 10 under sputtering operation, a negligible increase of temperature in the target portion 100a, easy handling and compactness, because the high efficiency of cooling said cooling block is mainly attributed to using the large thermal conductivity of materials, and a sophisticated cooling mechanism by machining and the amount of coolant flow rate for removing the thermal energy generated by plasma sputtering on the surface of target 110a.

The stripe-type plate 170a in contact with the top surface of the cooling block 150a is arranged so as to enclose over the outside surface of target 110a as illustrated in FIG. 2. The material of the stripe-type plate 170a in this example is the same as that of the target 110a, and used as a part of target 110a. The distribution of magnetic flux via the stripe-type plate 170a results in a small deposition rate on the surface of the stripe-type plate 170a, and then materials of the plate 170a are limitedly applied to adjust precisely the components of thin films in combination with the material of the target 110a.

All the functions of the target portion 100a result in the construction of cooling block 150a and, as illustrated, the target portion 100a is mounted on said side wall 11 of the vacuum vessel 10 via the electrically insulated plate 155a by using the screw bolt 112a positioned to be at a certain distance to join said attaching portion 160a to said chamber wall 11. FIG. 3 illustrates another arrangement of the target portion 100a wherein the pole of the magnet 130a (N-pole) is arranged so as to be nearer the air side position than the backside of target plane 110a, and the cooling ditch 151a formed in the backing plate 113a.

FIG. 4 shows a plan view of the cooling ditch 151a, screw bolts 111a, the separation plate 152a, the holes for coolant 153a and 154a and the position of N-pole of the magnet 130a. The vacuum sealing ring (not shown) such as O-ring of VITON® is inserted on the surface area of the cooling block 150a surrounding outside the screw bolts 111a. The temperature increase under sputtering is easily suppressed due to low gradient of temperature change through the surface of target 110a to said cooling block 150a.

The yoke (not shown) of magnets 131a is arranged to be closely in contact with the air side edge of the magnets 130a. The yoke is preferentially composed of soft ferromagnetic materials such as iron alloys. Use of the yoke results in the homogenous distribution of magnetic flux in the space of the vacuum vessel 10 and the compact size of magnet holding portion 131a in the cooling block 150a in case of using the high energy magnets such as Sm—Co and Ne—Fe—B alloys. The compact size of target portion 100a results in the reduction of processing time in addition to the cost reduction of the block materials.

The compact size of the magnetic holding portion 131a by the use of the high energy magnets provides smaller working space in a clean facility and economically an excellent effect in the industrial application in comparison with conventional equipment installation. The high energy magnets such as Sm—Co and Ne—B—Fe alloys are very easily oxidized and rapidly degrade the magnetic property after a few years period of contacting wet water usually containing chlorine or the recycles of thermal stress in a high temperature range. The present invention in the configuration of the magnet holding portion 131a provides a very stable usage of the high energy magnets such as Sm—Co and Ne—Fe—B alloys as illustrated by shielding easily permanent magnets 130a from air, waters and high temperatures in said target portion 100a. And, furthermore, an easy inspection of the magnet properties at a regular period of time because the magnets are installed in the magnet holder 131a in the air side as illustrated in FIGS. 2 and 3. This is the reason why the present invention provides a perfect solution on the degradation of the high energy magnets from oxidization by the use of such pastes as silicone for shielding the surface of the magnets in the magnet holding portion 131a with the shield plate 140a.

After a long period of operation, the surface of the target portion 100a may be covered with aluminum oxide layers which increase the surface roughness of the O-ring receiving groove, and the vacuum sealing by said O-rings might be degraded due to the increase of the aluminum oxide layers. The surface of the target portion 100a of the present invention is preferentially finished with covering such nonconducting layers as aluminum oxides. The double grooves for the O-rings are preferentially adapted for improving the vacuum sealing for a long period of operation in the present invention.

Figure 5:
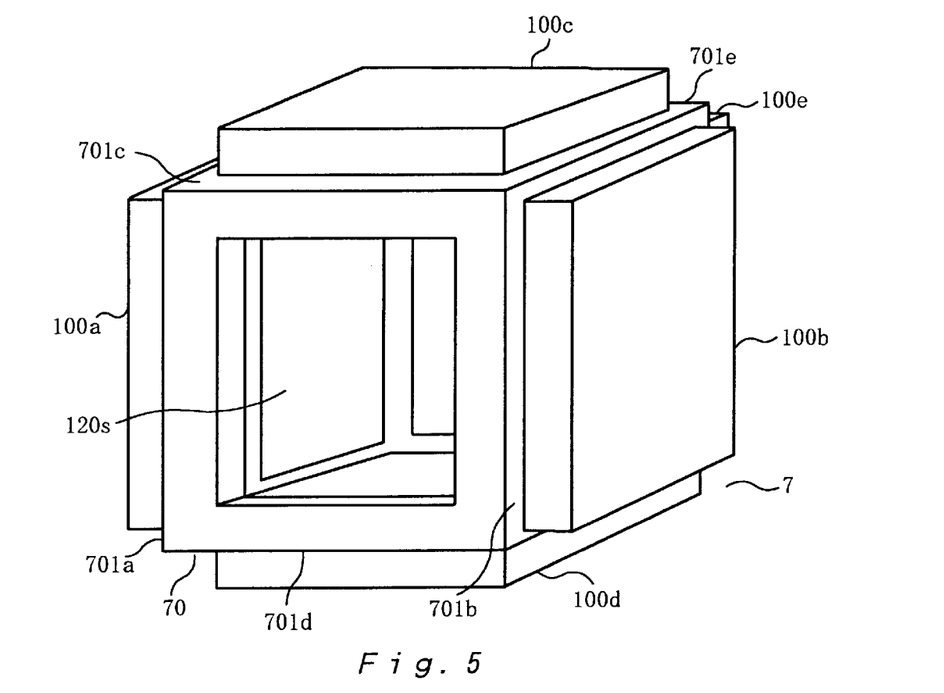
FIG. 5 is a schematic angled view from an open window 120s side of a box-type plasma unit 7 composed of a framework 70 holding five target portions.

The box-type of plasma unit 7 with one open window (outlet of said plasma space) 120s composed of five target portions as illustrated in FIG. 5 has a feature of mounting the five target portions 100a,100b,100c,100d and 100e on the five outside surfaces 701a,701b,701c,701d and 701e of a rectangular parallel piped frame work 70 by using screw bolts 112a, 112b, 112c, 112d and 112e and O-rings (not shown), respectively. Reference numerals 100a and 100b designate a pair of the target cathode portions. 100c, 100d and 100e are three target cathode portions without magnets. In the box-type of plasma unit 7, all the five target portions are mounted on the five outside surfaces of the frame work 70, not on the side-walls 11 of vacuum vessel 10. The wall providing the open window 120s of the unit 7 is mounted on one of the side walls 11 of the vacuum vessel 10 as in FIGS. 2, 3 and 6.

The magnetic flux distribution for generating and confining the sputtering plasma in the box-type of target unit follows the details described in the Japanese Unexamined Patent Publication No. H8-162679, in which a dense sputtering plasma is stably generated and confined in the box-type space due to three kinds of magneto-electric fields composed of planer magnetron mode, facing target mode and mirror type magnetron mode being generated in the entire space enclosed within the surfaces of the five target planes and in the vicinity of all the surfaces of five target planes, defining planar magnetron mode generated closely surrounding the outside edge surfaces of facing target planes 100a and 100b with magnetic flux parallel to said facing target planes and electric fields in the vicinity of said facing targets; facing target mode generated around the outside space between said facing target planes with magnetic flux perpendicular to said facing target planes and electric fields in the vicinity of said facing targets, and mirror magnetron mode generated in front of the surfaces of target planes 100c,100d and 100e vertically positioned adjacent the facing targets 100a and 100b with magnetic flux parallel to said target planes and electric fields in the vicinity of said all the targets.

Accordingly, the sputtered particles in the space of the box-type of target unit are generated from sputtering five target surfaces by sputtering gases supplied into the plasma space from a gas inlet not shown. Both the sputtered particles and gases transfer via the open window 120s to the substrate 20 in the vacuum vessel 10 wherein being maintained to be evacuated in a high vacuum. The sputtering gas inlet (not shown) is mounted on a part of the outside surface 701e of rectangular parallel piped frame work 70 or on the cooling block 150e of said target portion 100e.

Figure 6:
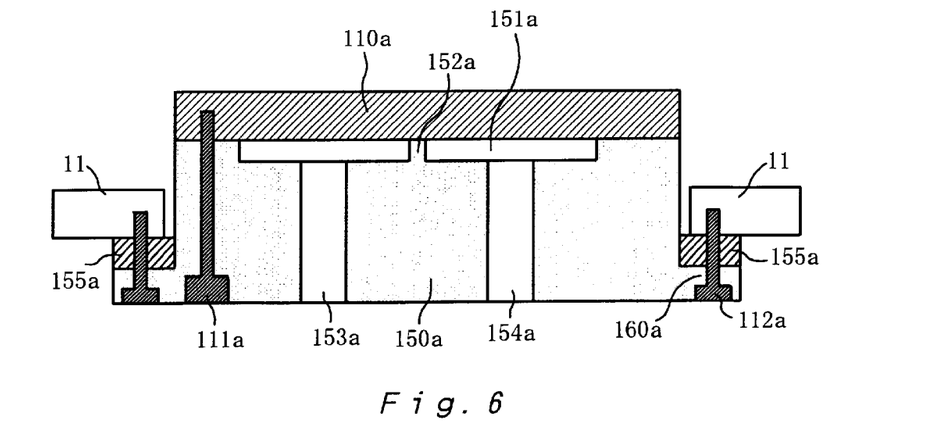
FIG. 6 is a cross-sectional view of another type of the facing target cathode portion without magnets which may be accommodated in the box-type plasma unit in FIG. 5.

The target portions 100c,100d and 100e are shown in FIG. 6 due to generation of mirror magnetron mode in combination with the facing target portions 100a and 100b.

Instead of the target portions 100c, 100d and 100e, three plate-like members are used for the box-type plasma unit 7 with one open window 120s as illustrated in FIG. 5. In this configuration of using three plate-like members, high quality of deposited films on the substrate is obtained so as to be similar to the case of the box-type plasma unit 7 being comprised of five target portions, because the deposited films of three plate-like members grow almost same materials in purity as those of five targets.

Figure 7:
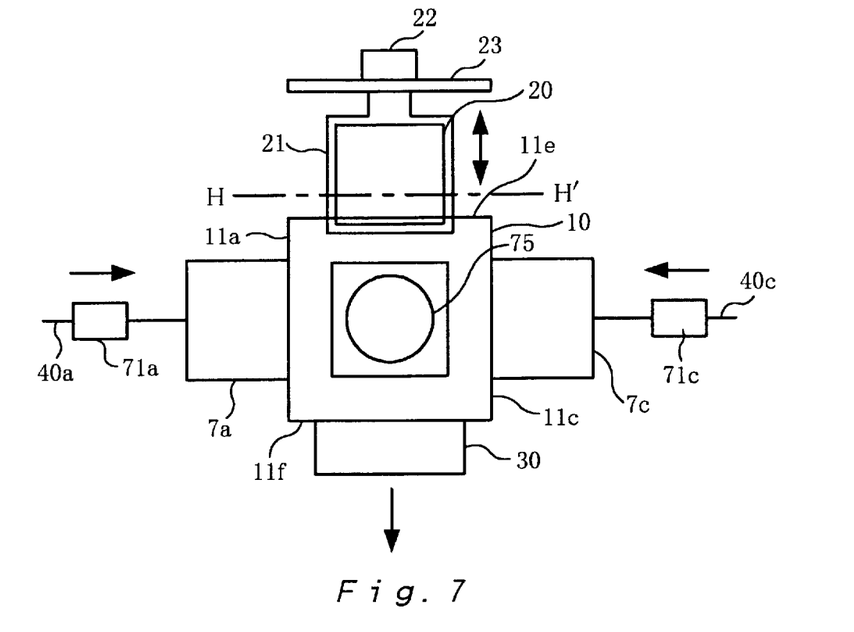
FIGS. 7 and 8 schematically illustrate an example of the facing target type apparatus adapting three box-type plasma units 7a, 7b and 7c being mounted on the side walls 11 of a vacuum vessel 10.
Figure 8:
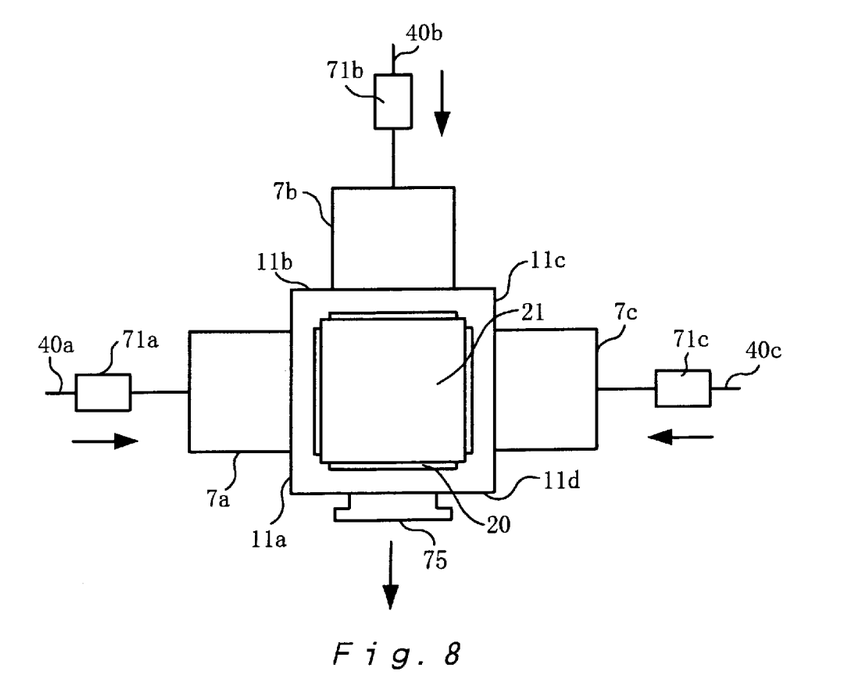

FIGS. 7 and 8 illustrate an example of the equipment of the present invention constructing a compact unit of the vacuum vessel 10 containing:

substrate holder means 21 with substrates 20;

three box-type plasma units 7*a*, 7*b* and 7*c* mounted on the side-walls 11*a*, 11*b* and 11*c* of said vacuum vessel 10; and a glass window 75 mounted on the side-wall 11*d* of said vacuum vessel 10.

FIG. 8 is a plan view taken along the line 8–8' of FIG. 7.

The substrate holder 21 comprised of means holding four substrates 20 is mounted on a vacuum plate 23 via a rotary vacuum connecter 22 so as to be rotated in a vacuum. The vacuum plate 23 is removably mounted on the upper wall 11*e* of said vacuum vessel 10 with sealing means (not shown). Therefore, the four substrates 20 are adjusted to face the three outlets of the box-type plasma units 7*a*,7*b* and 7*c* by operating the rotary vacuum connecter 22 in air. Then, the sputtered particles and sputter gases in the plasma space of the box-type plasma units 7*a*,7*b* and 7*c* are transferred to deposit on the substrate 20. Shutter plates (not shown) are arranged in the space between the substrates 20 and outlets of the box-type plasma units.

An outlet 30 connected with a vacuum exhaust system (not shown) is provided with the bottom wall 11*f* of said vacuum vessel 10. The glass wall 75 and vacuum sensors (not shown) may be provided with any walls of the vacuum vessel 10.

Predetermined amounts of sputtering gases are supplied to each gas inlet of the box-type plasma units 7*a*,7*b* and 7*c* via three gas pipes 40*a*,40*b*,40*c* and gas flow controllers 71*a*, 71*b* and 71*c*. The sputtered particles of different materials and gases generated individually from each box-type plasma unit such as 7*a*,7*b* and 7*c*, transfer effectively toward said substrate plane 20 in the vacuum vessel 10 due to the large pressure difference between each plasma space of the plasma units 7*a*,7*b* and 7*c* and the vicinity of the substrate planes due to the vacuum system configuration as illustrated in FIGS. 7 and 8.

From the foregoing description of the embodiments of the present invention, it will be understood that, in accordance with the present invention, no degradation of the quality of deposited films is achieved by the configuration of the sputtering plasma unit and said substrate holder in a closed vacuum vessel comprising:

the target holder and the magnetic field generating means composed of magnets separated so as to define a predetermined space from the inside wall-plane of the vacuum vessel and arranged to form a box-type sputtering plasma unit supplied therein with sputtering gas;

the outside wall-plane of the vacuum vessel for stationarily attaching the box-type plasma unit so as to deposit sputtered particles generated in the space of the sputtering plasma unit on the plane of a substrate; and means for holding the substrate at a position beside an open space extending the outlet of the sputtering plasma unit in the vacuum vessel.

What is claimed is:

1. A facing target sputtering apparatus for producing a film on a substrate comprising:

a closed vacuum vessel supplied therein with sputtering gas;

at least a pair of targets arranged so as to be spaced apart from one another within said closed vacuum vessel, each target of said pair of targets having a sputtering surface facing the sputtering surface of the other target of said pair of targets;

holding means for holding said pair of targets;

means for applying an electric power to said pair of targets to cause sputtering from the sputtering surface of each target of said pair of targets;

permanent magnets, arranged around each target of said pair of targets, generating at least a perpendicular magnetic field extending in a direction perpendicular to said sputtering surfaces to confine plasma in a space between said sputtering surfaces;

unit means for containing said permanent magnets, said holding means, and a cooling jacket, each target of said pair of targets being held on a front surface of said unit means by said holding means, said cooling jacket being formed by a cooling ditch in said unit means adjacent to a backside plane of each target of said pair of targets, said permanent magnets being installed in a cooling block cooled by said cooling jacket from a back side of said unit means and sealed from air, and being separated from said cooling jacket and separated from an inside space of said closed vacuum vessel, wherein said unit means is made of a machined material, has thermal conductivity and is mounted on outside wall-planes of said closed vacuum vessel; and means for holding the substrate at a position in a space in said closed vacuum vessel between said sputtering surfaces of said pair of targets.

2. A facing target supporting apparatus according to claim 1, wherein said material is composed of aluminum alloys.

3. A facing target sputtering apparatus according to claim 1, wherein said permanent magnets generate an auxiliary magnetic field to capture sputtered electrons at a region adjacent to and in front of at least peripheries of said pair of targets, with said auxiliary magnetic field having a magnetic field component in parallel with said sputtering surfaces of said pair of targets.

4. A facing target sputtering apparatus for producing a film on a substrate comprising:

a closed vacuum vessel supplied therein with sputtering gas;

a box plasma unit having a framework with one open side and five closed sides, said open side of said box plasma unit being mounted on an outside wall-plane of said closed vacuum vessel;

three plate members and a pair of targets closing said five closed sides of said framework, said pair of targets facing each other across said framework, each target having a sputtering surface facing the sputtering surface of the other target of said pair of targets;

holding means for holding each of said pair of targets;

permanent magnets, arranged around each of said targets, generating at least a perpendicular magnetic field extending in a direction perpendicular to said sputtering surface of each target to confine plasma in a space between said sputtering surfaces of said pair of targets;

unit means for containing said holding means and a cooling jacket, each target being held on a front surface of said unit means by said holding means, said cooling jacket being formed by a cooling ditch in said unit means adjacent to a backside of each target, said unit means further containing said permanent magnets outside said cooling jacket and separated from an inside space of said closed vacuum vessel, said unit means having thermal conductivity and being mounted on each of a pair of said five closed sides of said framework;

means for applying an electric power to said pair of targets to cause sputtering from said sputtering surface of each target; and means for holding the substrate at a position facing said open side of at least one of said box plasma units in said closed vacuum vessel.

5. A facing target sputtering apparatus according to claim 4, wherein said unit means is composed of aluminum alloys.

6. A facing target sputtering apparatus according to claim 4, wherein said closed vacuum vessel has a box shape.

7. A facing target sputtering apparatus according to claim 6, wherein said means for holding the substrate holds multiple substrates at positions respectively facing said open side of each of said box plasma units and for rotating said multiple substrates through each of said positions.

8. A facing target sputtering apparatus according to claim 4, wherein said sputtering gas is supplied to an inside space of each of said box plasma units and exhausted from said vacuum closed vessel.

9. A facing target sputtering according to claim 4, wherein said permanent magnets generate an auxiliary magnetic field to capture sputtered electrons at a region adjacent to and in front of at least peripheries of said pair of targets, with said auxiliary magnetic field having a magnetic field component in parallel with said sputtering surfaces of said pair of targets.

10. A facing target sputtering apparatus according to claim 4, wherein said permanent magnets are installed in said unit means from the backside of said unit means and sealed from air.

11. A facing target sputtering apparatus according to claim 4, wherein said unit means is made of a machined material.

12. A facing target sputtering apparatus for producing a film on a substrate comprising:

a closed vacuum vessel supplied therein with sputtering gas;

a box plasma unit having a framework with one open side and five closed sides, said open side of said box plasma unit being mounted on an outside wall-plane of said closed vacuum vessel;

targets closing said five closed sides of said framework, each target in a pair of said targets facing each other across said framework having a sputtering surface facing the sputtering surface of the other target of said pair of targets;

holding means for holding said targets;

permanent magnets, arranged around each of said pair of said targets, generating at least a perpendicular magnetic field extending in a direction perpendicular to said sputtering surface of each target to confine plasma in a space between said sputtering surfaces of said pair of targets;

unit means for containing said holding means and a cooling jacket, each target being held on a front surface of said unit means by said holding means, said cooling jacket being formed by a cooling ditch in said unit means adjacent to a backside of each target, said unit means for each target of said pair of targets further containing said permanent magnets outside said cooling jacket and separated from an inside space of said closed vacuum vessel, said unit means having thermal conductivity and being mounted on each of said five closed sides of said framework;

means for applying an electric power to said pair of targets to cause sputtering from said sputtering surface of each target; and means for holding the substrate at a position facing said open side of at least one of said box plasma units in said closed vacuum vessel.

13. A facing target sputtering apparatus according to claim 12, wherein said unit means is composed of aluminum alloys.

14. A facing target sputtering apparatus according to claim 12, wherein said closed vacuum vessel has a box shape.

15. A facing target sputtering apparatus according to claim 12, wherein said means for holding the substrate holds multiple substrates at positions respectively facing said open side of each of said box plasma units and for rotating said multiple substrates through each of said positions.

16. A facing target sputtering apparatus according to claim 12, wherein said sputtering gas is supplied to an inside space of each of said box plasma units and exhausted from said vacuum closed vessel.

17. A facing target sputtering according to claim 12, wherein said permanent magnets generate an auxiliary magnetic field to capture sputtered electrons at a region adjacent to and in front of at least peripheries of said pair of targets, with said auxiliary magnetic field having a magnetic field component in parallel with said sputtering surfaces of said pair of targets.

18. A facing target sputtering apparatus according to claim 12, wherein said permanent magnets are disposed in the backside of said unit means and sealed from air.

19. A facing target sputtering apparatus according to claim 12, wherein said unit means is made of a machined material.

* * * * *

UNITED STATES PATENT AND TRADEMARK OFFICE
CERTIFICATE OF CORRECTION

PATENT NO. : 6,156,172
DATED : December 5, 2000
INVENTOR(S) : Sadao Kadokura

Page 1 of 1

It is certified that error appears in the above-identified patent and that said Letters Patent is hereby corrected as shown below:

Claim 1, Column 12,
Line 30, "postion in a space" to be -- postion facing said space --.

Signed and Sealed this

Twenty-eighth Day of August, 2001

Attest:

*Nicholas P. Godici*

NICHOLAS P. GODICI
*Attesting Officer*     *Acting Director of the United States Patent and Trademark Office*